United States Patent
Do et al.

(10) Patent No.: US 8,404,518 B2
(45) Date of Patent: Mar. 26, 2013

(54) INTEGRATED CIRCUIT PACKAGING SYSTEM WITH PACKAGE STACKING AND METHOD OF MANUFACTURE THEREOF

(75) Inventors: Byung Tai Do, Singapore (SG); Rui Huang, Singapore (SG); Reza Argenty Pagaila, Singapore (SG)

(73) Assignee: STATS ChipPAC Ltd., Singapore (SG)

( * ) Notice: Subject to any disclaimer, the term of this patent is extended or adjusted under 35 U.S.C. 154(b) by 62 days.

(21) Appl. No.: 12/636,779

(22) Filed: Dec. 13, 2009

(65) Prior Publication Data

US 2011/0140258 A1 Jun. 16, 2011

(51) Int. Cl.
- H01L 21/50 (2006.01)
- H01L 21/48 (2006.01)
- H01L 21/44 (2006.01)
- H01L 23/02 (2006.01)
- H01L 23/52 (2006.01)
- H01L 27/146 (2006.01)

(52) U.S. Cl. ........ 438/109; 438/106; 257/686; 257/777; 257/E27.137; 257/E27.144

(58) Field of Classification Search .................. 438/106, 438/109; 257/686, 777, E27.137, E27.144
See application file for complete search history.

(56) References Cited

U.S. PATENT DOCUMENTS

| | | | | |
|---|---|---|---|---|
| 6,144,108 | A * | 11/2000 | Ohizumi et al. | 257/793 |
| 6,919,631 | B1 * | 7/2005 | Hoffman et al. | 257/707 |
| 6,972,481 | B2 * | 12/2005 | Karnezos | 257/686 |
| 7,098,073 | B1 | 8/2006 | Mangrum | |
| 7,180,166 | B2 * | 2/2007 | Ho et al. | 257/686 |
| 7,498,668 | B2 * | 3/2009 | Kawabata et al. | 257/686 |
| 7,528,474 | B2 * | 5/2009 | Lee | 257/686 |
| 7,615,858 | B2 | 11/2009 | Eun | |
| 7,618,849 | B2 | 11/2009 | Khan et al. | |
| 7,619,305 | B2 | 11/2009 | Fan et al. | |
| 7,723,834 | B2 * | 5/2010 | Hwang | 257/686 |
| 7,772,685 | B2 * | 8/2010 | Huang et al. | 257/686 |
| 2002/0056942 | A1 * | 5/2002 | Seng et al. | 264/272.17 |
| 2004/0065945 | A1 * | 4/2004 | Smith | 257/666 |
| 2004/0113253 | A1 * | 6/2004 | Karnezos | 257/686 |
| 2004/0135243 | A1 * | 7/2004 | Aoyagi | 257/686 |
| 2004/0183180 | A1 * | 9/2004 | Chung et al. | 257/686 |
| 2007/0216008 | A1 * | 9/2007 | Gerber | 257/686 |
| 2008/0088001 | A1 * | 4/2008 | Kim et al. | 257/686 |
| 2009/0230531 | A1 | 9/2009 | Do et al. | |
| 2009/0236726 | A1 | 9/2009 | Retuta et al. | |
| 2009/0243073 | A1 | 10/2009 | Carson et al. | |
| 2009/0273094 | A1 * | 11/2009 | Ha et al. | 257/777 |

* cited by examiner

*Primary Examiner* — Luan C Thai

(74) *Attorney, Agent, or Firm* — Ishimaru & Associates LLP

(57) ABSTRACT

A method of manufacture of an integrated circuit packaging system including: fabricating a base package substrate having component pads and stacking pads; coupling a base integrated circuit die to the component pads; forming a penetrable encapsulation material for enclosing the base integrated circuit die and the component pads on the base package substrate; and coupling stacked interconnects on the stacking pads adjacent to and not contacting the penetrable encapsulation material.

20 Claims, 4 Drawing Sheets

INTEGRATED CIRCUIT PACKAGING SYSTEM WITH PACKAGE STACKING AND METHOD OF MANUFACTURE THEREOF

TECHNICAL FIELD

The present invention relates generally to an integrated circuit packaging system, and more particularly to a system for stacking integrated circuit packages.

BACKGROUND ART

Electronic devices such as smart phones, personal digital assistants, location based devices, digital cameras, music players, computers, or video recorders, have become an integral part of many daily activities. Key components of these electronic devices are integrated circuit devices. These tiny integrated circuits must perform during daily activities including a wide variety of environmental conditions as well as potentially damaging forces. Many and varied types of packaging, intended for protection, interconnection or mounting, have been developed for integrated circuit devices.

When the dimension of a printed circuit board becomes smaller and smaller, the available surface for placing IC components becomes smaller and smaller as well. Conventionally, a number of IC semiconductor packages are side-by-side mounted on a printed circuit board which no longer can be implemented in advanced miniature electronic products. Therefore, in order to meet the requirements of smaller surface-mounting area and higher densities of components, 3D package is proposed by vertically stacking multiple semiconductor packages. This is also called POP (Package-On-Package) device.

Including requirements for multi-functional applications as well as miniaturization of electronic devices, various technologies have been studied and developed to provide high-capacity semiconductor products. Methods for providing the high-capacity semiconductor products include increasing the capacity of a memory chip, i.e., increased integration of the memory chip. The increased integration of the memory chip may be achieved by integrating more cells into a limited space of the semiconductor chip.

In recent years, demands for system-in-package (SIP) and multi-chip package (MCP) technologies have been rapidly increasing for applications in mobile appliances. The SIP is a special form of the MCP where different semiconductor devices (e.g., DRAM, SRAM, CPU, etc.) are integrated into one package. In the SIP and the MCP, even when only one semiconductor device is defective, the package is treated as a bad package although the other semiconductor devices in the package are not defective. Therefore, it is difficult to improve production yield of these types of packages.

A package-on-package approach allows testing of individual functions prior to joining the assembly. With increased demand for high volume devices and reduced cost a balance must be struck between volume demand and manufacturing loss due to defective assemblies.

Drawbacks of conventional designs include manufacturing defects caused for example by the molding process, where leakage or flash contaminates electrical contacts or the pressure of the mold chase may damage the substrate insulator. Other issues may include integrated circuit die cracking due to reduced thickness of the mold cap in order to maintain a thin package. The thin mold cap may also attribute to warpage of the package.

With the goal of increasing the amount of circuitry in a package, but without increasing the area of the package so that the package does not take up any more space on the circuit board, manufacturers have been stacking two or more die within a single package. Unfortunately, sufficient overlap for electrical interconnect, large footprint top packages, increased device integration, pre-testing, and interconnect lengths have plagued previous package designs.

Thus, a need still remains for a stacked integrated circuit packaging system to improve area and volume. In view of the ever-increasing commercial competitive pressures, along with growing consumer expectations and the diminishing opportunities for meaningful product differentiation in the marketplace, it is critical that answers be found for these problems. Additionally, the need to save costs, improve efficiencies and performance, and meet competitive pressures, adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides a method of manufacture of an integrated circuit packaging system including: fabricating a base package substrate having component pads and stacking pads; coupling a base integrated circuit die to the component pads; forming a penetrable encapsulation material for enclosing the base integrated circuit die and the component pads on the base package substrate; and coupling stacked interconnects on the stacking pads adjacent to and not contacting the penetrable encapsulation material.

The present invention provides an integrated circuit packaging system includes: a base package substrate having component pads and stacking pads; a base integrated circuit die coupled to the component pads; a penetrable encapsulation material to completely enclose the base integrated circuit die, and the component pads on the base package substrate; and stacked interconnects on the stacking pads adjacent to and not contacting the penetrable encapsulation material.

Certain embodiments of the invention have other steps or elements in addition to or in place of those mentioned above. The steps or element will become apparent to those skilled in the art from a reading of the following detailed description when taken with reference to the accompanying drawings.

BEST MODE FOR CARRYING OUT THE INVENTION

Figure 1:
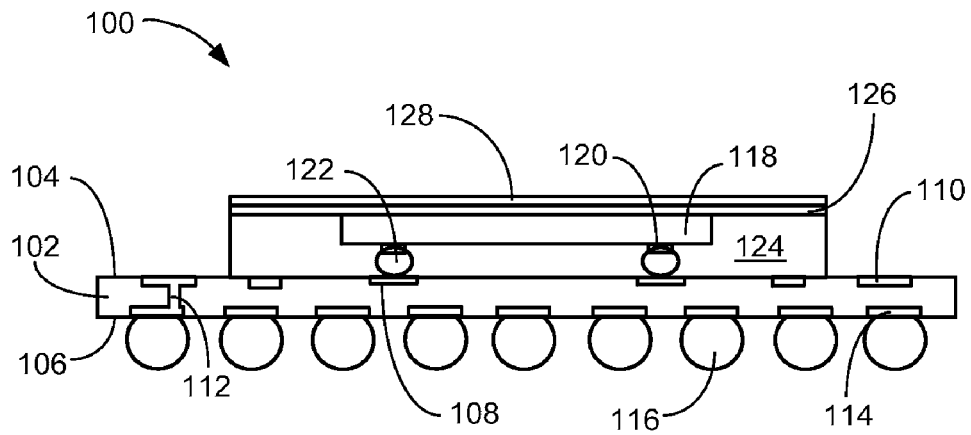
FIG. 1 is a cross-sectional view of a first embodiment of an integrated circuit packaging system with package stacking of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown exaggerated in the drawing FIGs. Similarly, although the views in the drawings for ease of description generally show similar orientations, this depiction in the FIGs. is arbitrary for the most part. Generally, the invention can be operated in any orientation.

Where multiple embodiments are disclosed and described, having some features in common, for clarity and ease of illustration, description, and comprehension thereof, similar and like features one to another will ordinarily be described with similar reference numerals. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of the base package substrate, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures. The term "on" means: that there is direct contact between elements with no intervening materials.

The term "processing" as used herein includes deposition of material or photoresist, patterning, exposure, development, etching, cleaning, and/or removal of the material or photoresist as required in forming a described structure.

Referring now to FIG. 1, therein is shown a cross-sectional view of a first embodiment of an integrated circuit packaging system 100 with package stacking of the present invention. The cross-sectional view of a first embodiment of the integrated circuit packaging system 100 depicts a base package substrate 102 having a component side 104 and a system side 106.

The base package substrate 102 may have component pads 108 and stacking pads 110 on the component side 104. Internal circuitry 112, such as vias, traces, or a combination thereof, may couple a system pad 114 to the component pad 108, the stacking pad 110, or a combination thereof.

System interconnects 116, such as solder balls, solder columns, solder bumps, or stud bumps, may be formed on the system pads for connection to a next level system, not shown. The base package substrate 102 may be configured as a very fine pitch ball grid array package (VFBGA). The VFBGA may have a pitch, or spacing of the system interconnects 116 of between 0.40 mm and 0.75 mm. The close proximity of the system interconnects 116 to each other also limits their diameter.

A base integrated circuit die 118, such as a flip chip or a wire bond integrated circuit, may have integrated circuit pads 120 formed on an active side. Chip interconnects 122, such as solder balls, solder bumps, or bond wires, and may couple the integrated circuit pads 120 to the component pads 108 on the component side 104 of the base package substrate 102.

A penetrable encapsulation material 124 is a B-stage material that is soft enough to have components embedded in it without causing deformation problems and that can be cured to a rigid state. The penetrable encapsulation material 124 may be formed on the component side 104, the base integrated circuit die 118, the component pads 108, and the chip interconnects 122.

It has been discovered that the application of the penetrable encapsulation material 124 to the base package substrate reduces cost and improves manufacturing yields. The yield improvement is due to the fact that there is no flash or overspill generated by the penetrable encapsulation material 124. Also since the penetrable encapsulation material 124 is applied by a die attach machine rather than a mold chase, there is no damage to the component side 104 of the base package substrate 102.

An insulation layer 126 may optionally be applied on the top surface of the penetrable encapsulation material 124. A stiffener 128 is mounted over the penetrable encapsulation material 124 and attached directly on the insulation layer 126 if it is present. The stiffener 128 may be made of metal, organic material, or inorganic material. The stiffener 128 may be implemented as a cover layer tape, which will allow an option to remove the stiffener from the final product.

It has been discovered that the stiffener 128 may enhance the rigidity of the base package substrate 102 and help prevent warping during the assembly process. It has also been discovered that the stiffener 128, when implemented as a conductive material can function as an electro-magnetic interference shield or a Faraday shield.

Figure 2:
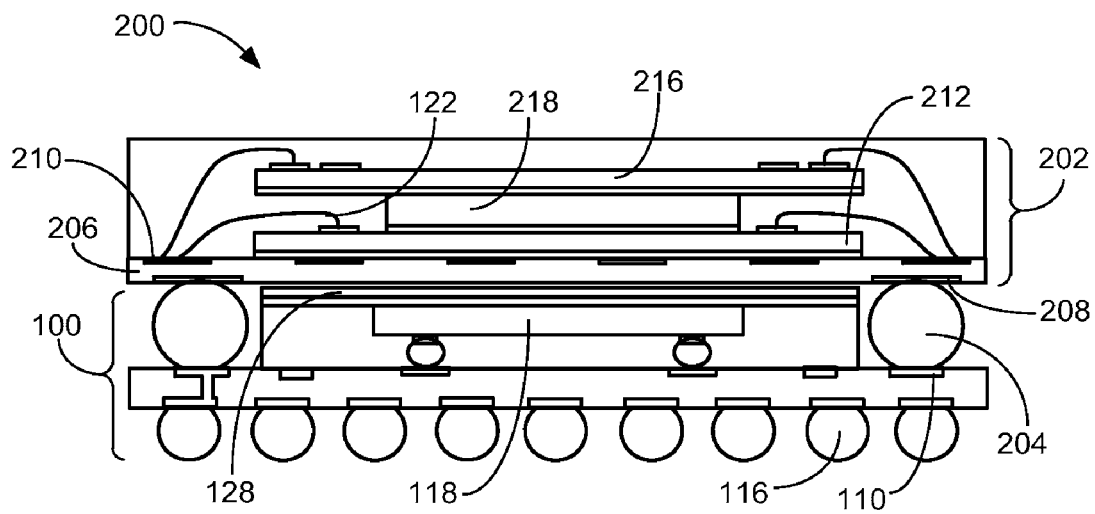
FIG. 2 is a cross-sectional view of an integrated circuit package stack utilizing the first embodiment of the present invention.

Referring now to FIG. 2, therein is shown a cross-sectional view of an integrated circuit package stack 200 utilizing the first embodiment of the present invention. The cross-sectional view of the integrated circuit package stack 200 depicts the integrated circuit packaging system 100 having a stacked package 202 coupled to the stacking pads 110 by stacked interconnects 204.

The stacked interconnects 204 may be solder balls or solder columns and are generally larger in diameter than the system interconnects 116. The stacked interconnects 204 extend beyond the penetrable encapsulation material 124 of FIG. 1 and the insulation layer 126 of FIG. 1, and have a height substantially equal to the stiffener 128. The stacked interconnects 204 may provide a spacing between the base package substrate 102 and a stacked package substrate 206.

The stacked package substrate 206 includes bottom side contacts 208 and top side contacts 210. The bottom side contacts 208 may be electrically connected to the top side contacts 210 by internal circuitry, not shown. A first stacked integrated circuit 212 may be electrically connected to the stacked package substrate 206 by the chip interconnect 122, such as a bond wire, coupled between a first integrated circuit die pad 214 and the top side contact 210.

The stacked package 202 is shown to include a second stacked integrated circuit 216 and a stacked spacer 218, but it is understood that this is an example only and that other configurations are possible. The stacked interconnects 204 may provide an electrical connection between the base integrated circuit die 118, the first stacked integrated circuit 212, the second stacked integrated circuit 216, the system interconnects 116, or a combination thereof.

It has been discovered that the stiffener 128 may act as a support in order to control the collapse height of the stacked interconnects 204 during the reflow process. In order to prevent inadvertent bridging between the stiffener 128 and the stacked interconnects 204, the stiffener 128 may have an oxide or solder resist coating, not shown, that renders it non-solder wettable.

Figure 3:
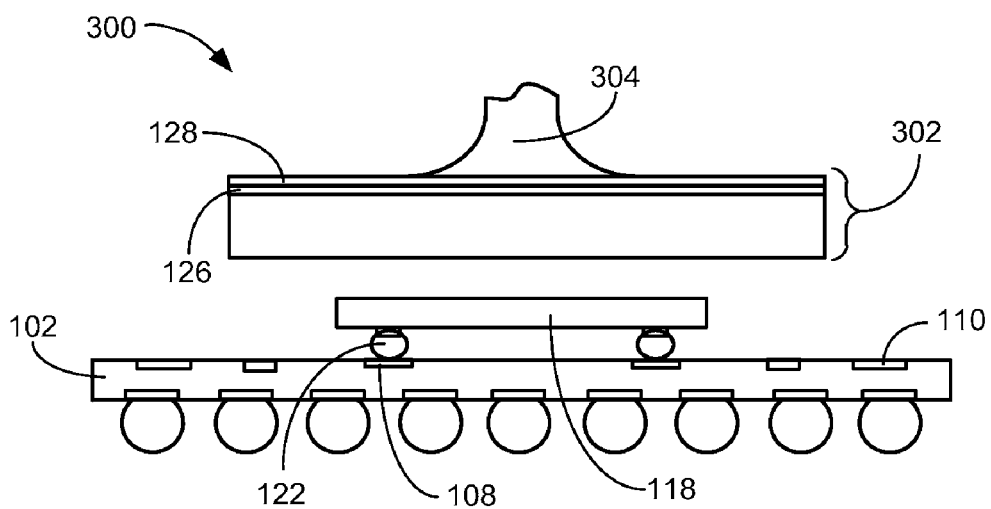
FIG. 3 is a cross-sectional view of an integrated circuit packaging assembly with package stacking in an encapsulation phase of manufacturing.

Referring now to FIG. 3, therein is shown a cross-sectional view of an integrated circuit packaging assembly 300 with package stacking in an encapsulation phase of manufacturing. The cross-sectional view of the integrated circuit packaging assembly 300 depicts the base package substrate 102 having the base integrated circuit die 118 coupled to the component pad 108 by the chip interconnects 122.

An encapsulation assembly 302 including the penetrable encapsulation material 124, the insulation layer 126, and the stiffener 128 may be positioned by a die attach device 304, such as a suction device used for placing integrated circuit dice (not shown) on a substrate (not shown). The penetrable encapsulation material 124 may be heated to increase its viscosity and allow the penetration of the base integrated circuit die 118 into the encapsulation assembly 302.

It has been discovered that the penetrable encapsulation material 124 may form a complete encapsulation of the base integrated circuit die 118 by flowing between the base package substrate 102 and the base integrated circuit die 118. When the encapsulation assembly 302 is cured the penetrable encapsulation material 124 forms an airtight seal on the base package substrate 102. It has further been discovered that the process associated with mounting the encapsulation assembly 302 does not damage the base package substrate 102 and no contamination is spread to the stacking pads 110. These factors increase the manufacturing yield and simplify the assembly process thereby reducing the cost of manufacturing.

Figure 4:
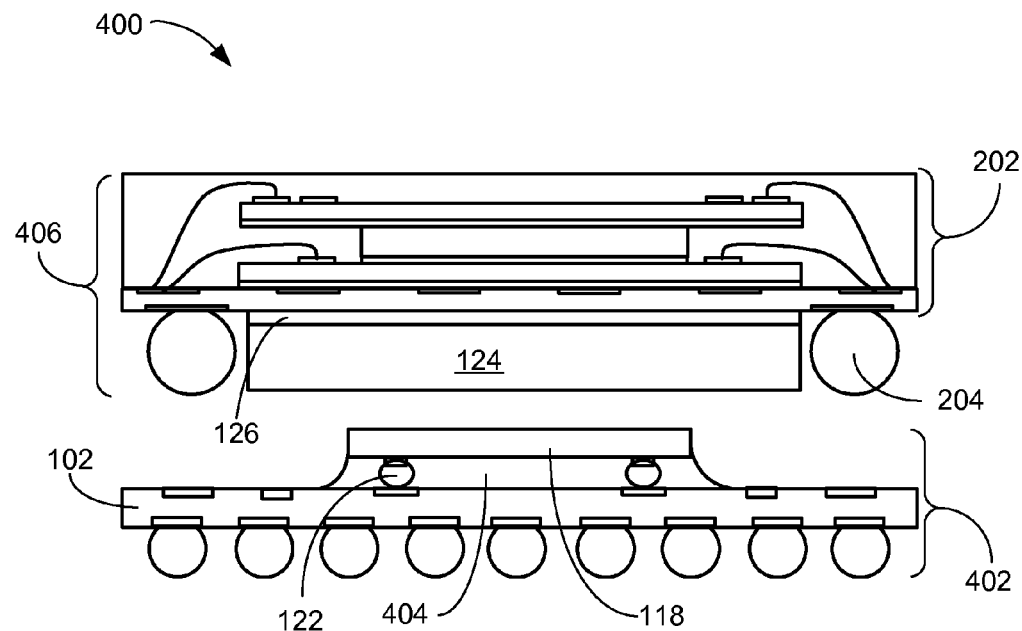
FIG. 4 is a cross-sectional view of an alternate construction of a first embodiment of an integrated circuit packaging assembly of the present invention.

Referring now to FIG. 4, therein is shown a cross-sectional view of an alternate construction of a first embodiment of an integrated circuit packaging assembly 400 of the present invention. The cross-sectional view of the alternate construction of the first embodiment of the integrated circuit packaging assembly 400 depicts a base package 402 having the base package substrate 102 and the base integrated circuit die 118 mounted thereon by the chip interconnects 122.

A sealing adhesive 404 may optionally be applied between the base package substrate 102 and the base integrated circuit die 118 to enclose the chip interconnects 122. The base package 402 may be tested and handled within the manufacturing process as it could represent a complete integrated circuit package.

The stacked package 202 may have the stacked interconnects 204 and the penetrable encapsulation material 124 mounted on the bottom surface of the stacked package substrate 206. The stacked package substrate 206 of FIG. 2 directly contacts the insulation layer 126 above the base package substrate 102 to have the insulation layer 126 attached to and between the penetrable encapsulation material 124 and the stacked package substrate 206. This grouping may form a stacked package encapsulation assembly 406.

It has been discovered that manufacturing process may be further shortened by pre-mounting the penetrable encapsulation material 124, by the insulation layer 126, and the stacked interconnects 204 on the stacked package 202. In this fashion, the reflow process that attaches the stacked interconnects 204 to the base package substrate 102, also may allow the penetrable encapsulation material 124 to form a seal on the base package substrate 102. The sealing adhesive 404 is optional in this process because the reflow process time may be insufficient to assure the penetrable encapsulation material 124 would completely flow under the base integrated circuit die 118.

Figure 5:
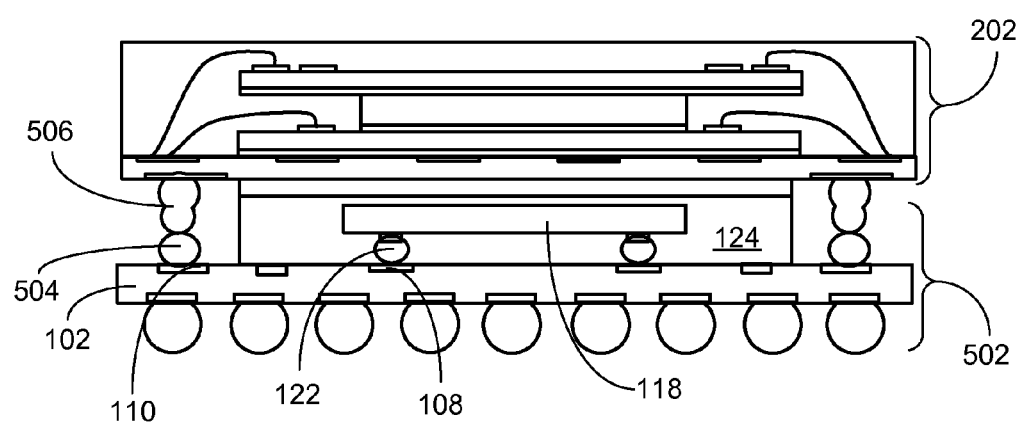
FIG. 5 is a cross-sectional view of an integrated circuit package stack utilizing a second embodiment of the present invention.

Referring now to FIG. 5, therein is shown a cross-sectional view of an integrated circuit package stack 500 utilizing a second embodiment of the present invention. The cross-sectional view of the integrated circuit package stack 500 depicts a base package 502 having the base package substrate 102 with the base integrated circuit die 118 coupled to the component pads 108 by the chip interconnects 122.

The penetrable encapsulation material 124 may be on the base package substrate 102 and the base integrated circuit die 118. Stacked base balls 504 may be coupled to the stacking pads 110 in preparation for coupling the stacked package 202 by stud bumps 506.

It has been discovered that the base package 502 may be formed by coupling the stacked base balls 504 to the integrated circuit packaging system 100, of FIG. 1. It has further been discovered that narrow diameter of the stud bumps 506 combined with the narrow diameter of the stacked base balls 504 may allow a finer pitch between the stacking pads 110 and may allow multiple rows or arrays of the stacking pads 110 to be formed on the base package substrate 102.

Figure 6:
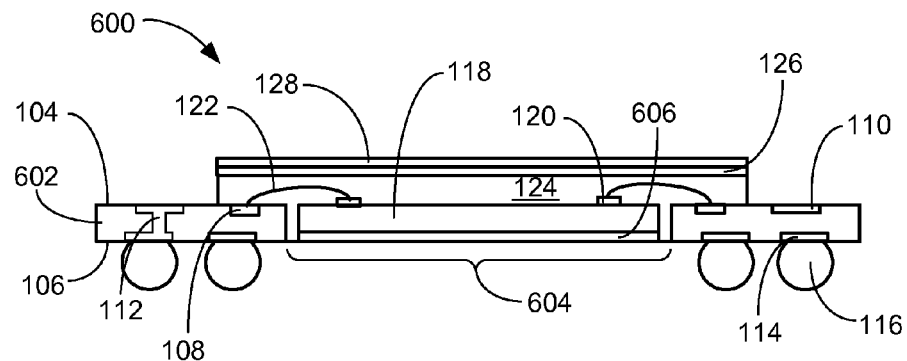
FIG. 6 is a cross-sectional view of an integrated circuit packaging system with package stacking in a third embodiment of the present invention.

Referring now to FIG. 6, therein is shown a cross-sectional view of an integrated circuit packaging system 600 with package stacking in a third embodiment of the present invention. The cross-sectional view of the integrated circuit packaging system 600 depicts a base package substrate 602 having a central cavity 604.

The base package substrate 602 may also have the component side 104 and the system side 106. The base package substrate 602 may have the component pads 108 and the stacking pads 110 on the component side 104. The internal circuitry 112, such as vias, traces, or a combination thereof, may couple the system pad 114 to the component pad 108, the stacking pad 110, or a combination thereof.

The system interconnects 116, such as solder balls, solder columns, solder bumps, or stud bumps, may be formed on the system pads for connection to a next level system, not shown. The base package substrate 602 may be configured as a very fine pitch ball grid array package (VFBGA). The VFBGA may have a pitch, or spacing, of the system interconnects 116 of between 0.40 mm and 0.75 mm. The close proximity of the system interconnects 116 to each other also limits their diameter.

The base integrated circuit die 118, such as a wire bond integrated circuit, may have the integrated circuit pads 120 formed on an active side. The base integrated circuit die 118 may be mounted in the central cavity 604 of the base package substrate 602 on an insulator 606.

The insulator 606 may provide electrical isolation for the base integrated circuit die 118 after assembly. The chip interconnects 122 may couple the integrated circuit pads 120 to the component pads 108 on the component side 104 of the base package substrate 602.

The penetrable encapsulation material 124 is a B-stage material that is soft enough to have components embedded in it without causing deformation problems and that can be cured to a rigid state. The penetrable encapsulation material 124 may be formed on the component side 104, the base integrated circuit die 118, the component pads 108, and the chip interconnects 122. The penetrable encapsulation material 124 also fills the central cavity 604 of the base package substrate 602.

It has been discovered that the application of the penetrable encapsulation material 124 to the base package substrate reduces cost and improves manufacturing yields. The yield improvement is due to the fact that there is no flash or overspill generated by the penetrable encapsulation material 124. Also since the penetrable encapsulation material 124 is applied by a die attach machine rather than a mold chase, there is no damage to the component side 104 of the base package substrate 602.

The insulation layer 126 may optionally be applied on the top surface of the penetrable encapsulation material 124. The stiffener 128 is mounted over the penetrable encapsulation material 124 and on the insulation layer 126 if it is present. The stiffener 128 may be made of metal, organic material, or inorganic material. The stiffener 128 may be implemented as a cover layer tape, which will allow the option to remove the stiffener 128 from the final product if desired.

It has been discovered that the stiffener 128 may enhance the rigidity of the base package substrate 102 and help prevent warping during the assembly process. It has also been discovered that the stiffener 128, when implemented as a conductive material can function as an electro-magnetic interference shield or a Faraday shield. Further it has been discovered that the penetrable encapsulation material 124 once cured may form a coplanar surface with the system side 106, of the base package substrate 602, and the insulator 606.

Figure 7:
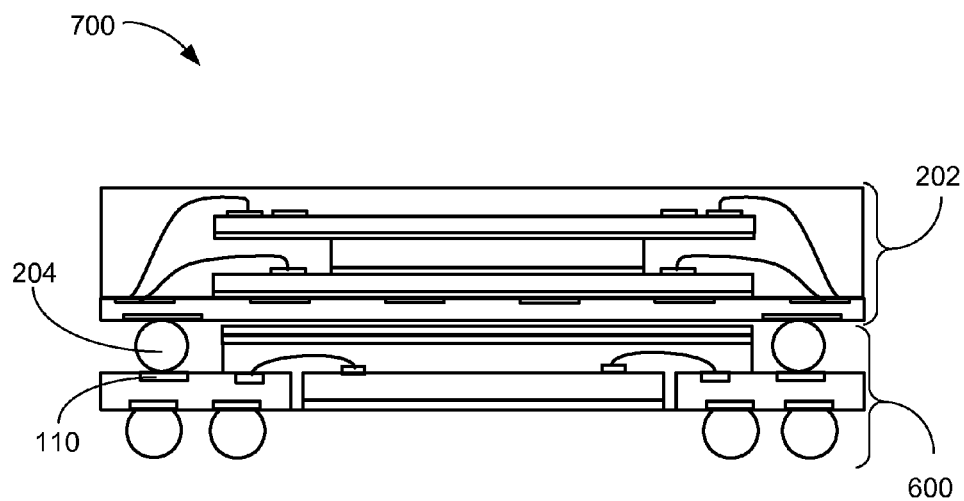
FIG. 7 is a cross-sectional view of an integrated circuit package stack utilizing the third embodiment of the present invention.

Referring now to FIG. 7, therein is shown a cross-sectional view of an integrated circuit package stack 700 utilizing the third embodiment of the present invention. The cross-sectional view of the integrated circuit package stack 700 depicts the integrated circuit packaging system 600 having the stacked package 202 coupled to the stacking pads 110 by the stacked interconnects 204.

It has been discovered that the stacked package 202 may be a further embodiment of the integrated circuit packaging system 600, which could provide additional stacking opportunities.

Figure 8:
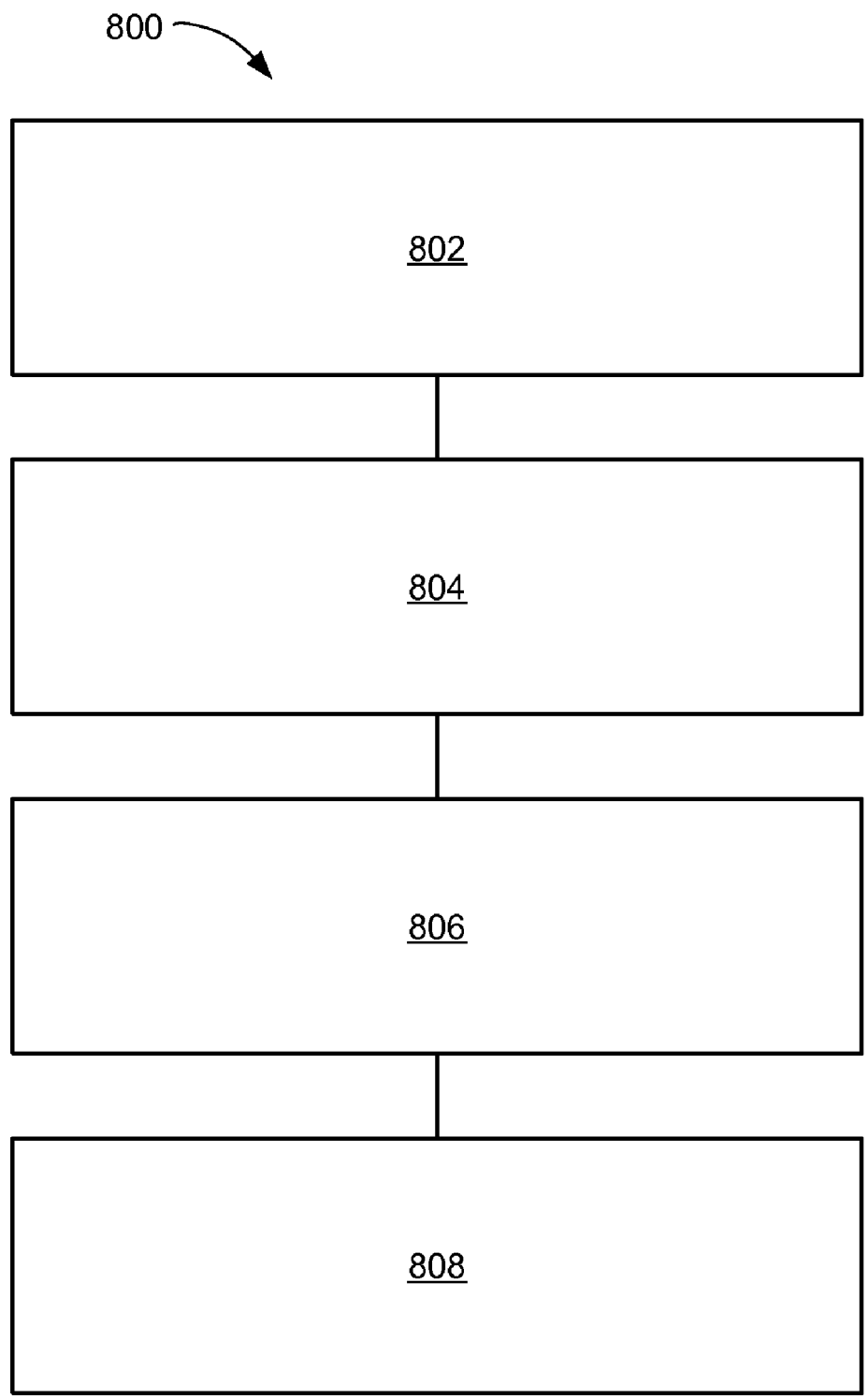
FIG. 8 is a flow chart of a method of manufacture of an integrated circuit packaging system in an embodiment of the present invention.

Referring now to FIG. 8, therein is shown a flow chart of a method 800 of manufacture of an integrated circuit packaging system in an embodiment of the present invention. The method 800 includes: fabricating a base package substrate having component pads and stacking pads in a block 802; coupling a base integrated circuit die to the component pads in a block 804; forming a penetrable encapsulation material for enclosing the base integrated circuit die and the component pads on the base package substrate in a block 806; and coupling stacked interconnects on the stacking pads adjacent to and not contacting the penetrable encapsulation material in a block 808.

The resulting method, process, apparatus, device, product, and/or system is straightforward, cost-effective, uncomplicated, highly versatile and effective, can be surprisingly and unobviously implemented by adapting known technologies, and are thus readily suited for efficiently and economically manufacturing integrated circuit packaging systems fully compatible with conventional manufacturing methods or processes and technologies.

Another important aspect of the present invention is that it valuably supports and services the historical trend of reducing costs, simplifying systems, and increasing performance.

These and other valuable aspects of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacture of an integrated circuit packaging system comprising:
    fabricating a base package substrate having a component pad and a stacking pad;
    coupling a base integrated circuit die to the component pad;
    forming a penetrable encapsulation material for enclosing the base integrated circuit die and the component pad on the base package substrate;
    applying an insulation layer directly contacting the penetrable encapsulation material;
    attaching a stiffener or a stacked package substrate directly contacting the insulation layer; and
    coupling stacked interconnects on the stacking pads adjacent to and not contacting the penetrable encapsulation material.

2. The method as claimed in claim 1 wherein attaching the stiffener includes mounting the stiffener over the penetrable encapsulation material.

3. The method as claimed in claim 1 wherein attaching the stacked package substrate includes coupling a stacked package having the stacked package substrate on the stacked interconnects.

4. The method as claimed in claim 1 further comprising coupling a system pad to the component pad, the stacking pad, or a combination thereof.

5. The method as claimed in claim 1 wherein fabricating the base package substrate includes providing the base package substrate having a central cavity for mounting the base integrated circuit die in the central cavity.

6. A method of manufacture of an integrated circuit packaging system comprising:
    fabricating a base package substrate having a component pad and a stacking pad on a component side;
    coupling a base integrated circuit die to the component pad includes coupling chip interconnects between the component pad and an integrated circuit pad on the base integrated circuit die;
    forming a penetrable encapsulation material for enclosing the base integrated circuit die and the component pad on the base package substrate includes positioning by a die attach device the penetrable encapsulation material;
    applying an insulation layer directly contacting the penetrable encapsulation material;
    attaching a stiffener or a stacked package substrate directly contacting the insulation layer; and
    coupling stacked interconnects on the stacking pad adjacent to and not contacting the penetrable encapsulation material includes coupling a solder ball, a solder, column, a stud bump, or a combination thereof.

7. The method as claimed in claim 6 wherein attaching the stiffener includes mounting the stiffener over the insulation layer and the penetrable encapsulation material, the insulation layer between the stiffener and the penetrable encapsulation material.

8. The method as claimed in claim 6 wherein attaching the stacked package substrate includes coupling a stacked package having the stacked package substrate on the stacked interconnects includes coupling a first stacked integrated circuit to the base integrated circuit die through the stacked interconnects.

9. The method as claimed in claim 6 further comprising coupling a system pad to the component pad, the stacking pad, or a combination thereof includes fabricating internal circuitry between the system pad, the component pad, the stacking pad, or a combination thereof.

10. The method as claimed in claim 6 wherein fabricating the base package substrate includes providing the base package substrate having a central cavity for mounting the base integrated circuit die in the central cavity includes applying an insulator under the base integrated circuit die.

11. An integrated circuit packaging system comprising:
a base package substrate having a component pad and a stacking pad;
a base integrated circuit die coupled to the component pad;
a penetrable encapsulation material to completely enclose the base integrated circuit die and the component pad on the base package substrate;
an insulation layer directly attached to the penetrable encapsulation material;
a stiffener or a stacked package substrate directly attached to the insulation layer over the penetrable encapsulation material; and
stacked interconnects on the stacking pad adjacent to and not contacting the penetrable encapsulation material.

12. The system as claimed in claim 11 wherein the stiffener is mounted over the penetrable encapsulation material.

13. The system as claimed in claim 11 further comprising a stacked package having the stacked package substrate coupled on the stacked interconnects.

14. The system as claimed in claim 11 further comprising a system pad coupled to the component pad, the stacking pad, or a combination thereof.

15. The system as claimed in claim 11 wherein the base package substrate includes the base package substrate having a central cavity for mounting the base integrated circuit die in the central cavity.

16. The system as claimed in claim 11 further comprising:
a component side on the base package substrate;
chip interconnects between the component pad and an integrated circuit pad on the base integrated circuit die; and
a solder ball, a solder column, a stud bump, or a combination thereof on the stacking pad.

17. The system as claimed in claim 16 wherein the stiffener is over the insulation layer and the penetrable encapsulation material, the insulation layer between the stiffener and the penetrable encapsulation material.

18. The system as claimed in claim 16 further comprising a stacked package having the stacked package substrate on the stacked interconnects and a first stacked integrated circuit coupled to the base integrated circuit die through the stacked interconnects.

19. The system as claimed in claim 16 further comprising a system pad coupled to the component pad, the stacking pad, or a combination thereof includes internal circuitry between the system pad, the component pad, the stacking pad, or a combination thereof.

20. The system as claimed in claim 16 wherein the base package substrate includes the base package substrate with a central cavity and the base integrated circuit die mounted in the central cavity includes an insulator under the base integrated circuit die.

* * * * *